(12) United States Patent
Wiatr et al.

(10) Patent No.: US 7,897,451 B2
(45) Date of Patent: Mar. 1, 2011

(54) METHOD FOR CREATING TENSILE STRAIN BY SELECTIVELY APPLYING STRESS MEMORIZATION TECHNIQUES TO NMOS TRANSISTORS

(75) Inventors: Maciej Wiatr, Dresden (DE); Casey Scott, Dresden (DE); Andreas Gehring, Dresden (DE); Peter Javorka, Radeburg (DE); Andy Wei, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 12/123,524

(22) Filed: May 20, 2008

(65) Prior Publication Data

US 2009/0142900 A1 Jun. 4, 2009

(30) Foreign Application Priority Data

Nov. 30, 2007 (DE) ........................ 10 2007 057 687

(51) Int. Cl.
*H01L 21/8238* (2006.01)
(52) U.S. Cl. ................ 438/231; 438/305; 257/E21.634
(58) Field of Classification Search ................ 438/293, 438/301, 303, 305–307, 199–233, 778–794; 257/E21.409, 369–377, 204, E27.06–E27.067, 257/E27.108, E21.632–E21.643
See application file for complete search history.

(56) References Cited

U.S. PATENT DOCUMENTS

| | | | | |
|---|---|---|---|---|
| 6,512,273 B1 | 1/2003 | Krivokapic et al. | ......... | 257/369 |
| 2002/0042166 A1* | 4/2002 | Nandakumar et al. | ....... | 438/142 |
| 2005/0095765 A1* | 5/2005 | Saiki et al. | ................. | 438/197 |
| 2005/0142828 A1* | 6/2005 | Kammler et al. | ............ | 438/595 |
| 2006/0099765 A1* | 5/2006 | Yang | ........................ | 438/301 |
| 2006/0189048 A1* | 8/2006 | Mehrotra et al. | ............ | 438/151 |
| 2007/0010073 A1 | 1/2007 | Chen et al. | ................. | 438/486 |
| 2008/0026572 A1* | 1/2008 | Wirbeleit et al. | ............ | 438/663 |
| 2008/0057636 A1* | 3/2008 | Lindsay et al. | .............. | 438/199 |
| 2009/0053865 A1* | 2/2009 | Johnson et al. | ............. | 438/230 |
| 2009/0081836 A1* | 3/2009 | Liu et al. | .................... | 438/229 |

OTHER PUBLICATIONS

Wei et al., "Multiple Stress Memorization in Advanced SOI CMOS Technologies," 2007 *Symposium on VLSI Technology Digest of Technical Papers*, pp. 216-217, 2007.
Translation of Official Communication from German Patent Office for German Patent Application No. 10 2007 057 687.2 dated Aug. 12, 2008.

* cited by examiner

*Primary Examiner*—Matthew C Landau
*Assistant Examiner*—Aaron Staniszewski
(74) *Attorney, Agent, or Firm*—Williams, Morgan & Amerson, P.C.

(57) ABSTRACT

By selectively applying a stress memorization technique to N-channel transistors, a significant improvement of transistor performance may be achieved. High selectivity in applying the stress memorization approach may be accomplished by substantially maintaining the crystalline state of the P-channel transistors while annealing the N-channel transistors in the presence of an appropriate material layer which may not to be patterned prior to the anneal process, thereby avoiding additional lithography and masking steps.

21 Claims, 11 Drawing Sheets

METHOD FOR CREATING TENSILE STRAIN BY SELECTIVELY APPLYING STRESS MEMORIZATION TECHNIQUES TO NMOS TRANSISTORS

BACKGROUND OF THE INVENTION

1. Field of the Invention

Generally, the present disclosure relates to the formation of integrated circuits, and, more particularly, to the formation of transistors having strained channel regions by using stress-inducing sources to enhance charge carrier mobility in the channel region of a MOS transistor.

2. Description of the Related Art

Generally, a plurality of process technologies are currently practiced to fabricate integrated circuits, wherein, for complex circuitry, such as microprocessors, storage chips and the like, CMOS technology is currently one of the most promising approaches due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode located close to the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, the conductivity of the channel region is a dominant factor that determines the performance of MOS transistors. Thus, the reduction of the channel length, and associated therewith the reduction of the channel resistivity, is an important design criterion for accomplishing an increase in the operating speed of the integrated circuits.

The continuing shrinkage of the transistor dimensions, however, involves a plurality of issues associated therewith, such as reduced controllability of the channel, also referred to as short channel effects, and the like, that have to be addressed so as to not unduly offset the advantages obtained by steadily decreasing the channel length of MOS transistors. For instance, the thickness of the gate insulation layer, typically an oxide-based dielectric, has to be reduced when reducing the gate length, wherein a reduced thickness may result in increased leakage currents, thereby posing limitations for oxide-based gate insulation layers at approximately 1-2 nm. Thus, the continuous size reduction of the critical dimensions, i.e., the gate length of the transistors, necessitates the adaptation and possibly the new development of highly complex process techniques, for example, for compensating for short channel effects with oxide-based gate dielectric scaling being pushed to the limits with respect to tolerable leakage currents. It has, therefore, been proposed to also enhance the channel conductivity of the transistor elements by increasing the charge carrier mobility in the channel region for a given channel length, thereby offering the potential for achieving a performance improvement that is comparable with the advance to a future technology node while avoiding or at least postponing many of the problems encountered with the process adaptations associated with device scaling.

One efficient mechanism for increasing the charge carrier mobility is the modification of the lattice structure in the channel region, for instance, by creating tensile or compressive stress in the vicinity of the channel region to produce a corresponding strain in the channel region, which results in a modified mobility for electrons and holes, respectively. For example, creating uniaxial tensile strain in the channel region along the channel length direction for a standard crystallographic orientation increases the mobility of electrons, which, in turn, may directly translate into a corresponding increase in the conductivity. On the other hand, uniaxial compressive strain in the channel region for the same configuration may increase the mobility of holes, thereby providing the potential for enhancing the performance of P-type transistors. The introduction of stress or strain engineering into integrated circuit fabrication is an extremely promising approach for further device generations, since, for example, strained silicon may be considered as a "new" type of semiconductor material, which may enable the fabrication of fast powerful semiconductor devices without requiring expensive semiconductor materials, while many of the well-established manufacturing techniques may still be used.

In some approaches, external stress created by, for instance, permanent overlaying layers, spacer elements and the like is used in an attempt to create a desired strain within the channel region. Although a promising approach, the process of creating the strain in the channel region by applying a specified external stress may depend on the efficiency of the stress transfer mechanism for the external stress provided, for instance, by contact layers, spacers and the like into the channel region to create the desired strain therein. Thus, for different transistor types, differently stressed overlayers have to be provided, which may result in a plurality of additional process steps, wherein, in particular, any additional lithography steps may significantly contribute to the overall production costs. Moreover, the amount of stress-inducing material, and in particular the intrinsic stress thereof, may not be arbitrarily increased without requiring significant design alterations. For example, the degree of tensile stress in corresponding portions of the dielectric layer formed above an N-channel transistor may require development of new deposition recipes, while significantly higher compressive stress may be provided by presently established techniques, thereby creating an imbalance with respect to performance of NMOS and PMOS transistors.

In still a further approach, a substantially amorphized region may be formed adjacent to the gate electrode at an intermediate manufacturing stage, which may then be re-crystallized in the presence of a rigid layer formed above the transistor area. During the anneal process for re-crystallizing the lattice, the growth of the crystal will occur under stress conditions created by the overlayer and result in a strained crystal. After the re-crystallization, the stress-inducing layer may be partly or completely removed, wherein, nevertheless, a certain amount of strain may be "conserved" in the re-grown lattice portion. This effect is generally known as stress memorization. Although the exact mechanism is not yet fully understood, it is believed that, upon re-crystallization of the substantially amorphized material, the increased volume of the amorphous material compared to the crystalline material may be substantially maintained due to the presence of the rigid surface layer that reduces or prevents the natural volume reduction which would usually occur during the re-crystallization. Hence, the strained re-grown crystalline material may induce a corresponding tensile strain in the region adjacent to the re-crystallized region of increased volume. The tensile strain may thus also be maintained after removal of a portion or all of the rigid surface layer.

Since many efficient strain-inducing mechanisms are available for PMOS transistors, such as embedded strained silicon/germanium material, stressed contact etch stop layers of very high intrinsic compressive stress and the like, respective strain engineering techniques may be desirable to preferably enhance performance of NMOS transistors.

However, currently practiced stress memorization techniques, although providing moderate advantages in device performance, may not provide the potential for significantly extending the limitations of performance gain of NMOS transistors while not unduly contributing to process complexity of the overall manufacturing process. Moreover, the applying stress memorization techniques to PMOS and NMOS transistors may result in a degradation of performance of PMOS transistors, which may partially offset the performance gain of the NMOS transistors. For this reason, selective stress memorization approaches may be considered, in which the rigid material layer may be removed from the PMOS transistors prior to actually re-crystallizing the drain and source areas of the PMOS and NMOS transistors, thereby, however, contributing to overall process time and complexity. In addition, the required mask and selective etch steps may contribute to an increased probability of reducing production yield, although well-established recipes may be used, while experimental data seem to indicate that PMOS degradation may not be fully addressed by these selective stress memorization techniques.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to techniques for enhancing transistor performance of transistors on the basis of tensile strain in the respective channel regions by using stress memorization techniques while substantially avoiding a negative impact of the stress memorization technique on other transistors. This may be accomplished by maintaining a substantially crystalline state of one type of transistor while creating enhanced implantation-induced damage in the other type of transistor prior to annealing the transistors on the basis of a rigid material layer, substantially without adding undue process complexity. That is, a process sequence may be provided in which implantation-induced damage may be maintained at a low level, for instance, for P-channel transistors, while a highly damaged or even substantially amorphized state may be provided on other transistors, such as N-channel transistors, thereby enabling a substantially strained re-crystallization of the highly damaged regions while not significantly affecting the crystalline state of the other type of transistor. In this manner, the performance of one type of transistor may be enhanced, while substantially not negatively affecting the other type of transistors.

One illustrative method disclosed herein comprises forming shallow drain and source regions of an N-channel transistor, wherein shallow drain and source regions of a P-channel transistor are in a substantially crystalline state. The method further comprises forming at least a portion of drain and source regions of an N-channel transistor while maintaining the substantially crystalline state of the shallow drain and source regions of the P-channel transistor. Furthermore, a material layer is formed above the P-channel transistor and the N-channel transistor and implantation-induced damage in the at least a portion of the drain and source regions of the N-channel transistor is re-crystallized by annealing the P-channel transistor and the N-channel transistor in the presence of the material layer.

A further illustrative method disclosed herein comprises forming a sacrificial material layer above a first transistor and a second transistor, wherein the first transistor has a shallow drain and source region in a substantially crystalline state while the second transistor comprises shallow drain and source regions and at least a first deeper drain and source portion. The method further comprises annealing the first and second transistors in the presence of the sacrificial material layer. Finally, the sacrificial material layer is removed prior to forming at least the first deeper drain and source portion in the first transistor.

A still further illustrative method disclosed herein comprises defining at least a shallow drain and source region in a first plurality of transistors by ion implantation. The method further comprises annealing the first plurality of transistors to reduce implantation-induced damage. Additionally, at least a shallow drain and source region is defined in a second plurality of transistors by ion implantation and a material layer is formed above the first and second pluralities of transistors. The method further comprises annealing the first and second pluralities of transistors in the presence of the material layer to re-crystallize implantation-induced damage in the second plurality of transistors. Finally, the material layer is at least partially removed after annealing the first and second pluralities of transistors.

BRIEF DESCRIPTION OF THE DRAWINGS

The disclosure may be understood by reference to the following description taken in conjunction with the accompanying drawings, in which like reference numerals identify like elements, and in which.

Figure 1A:
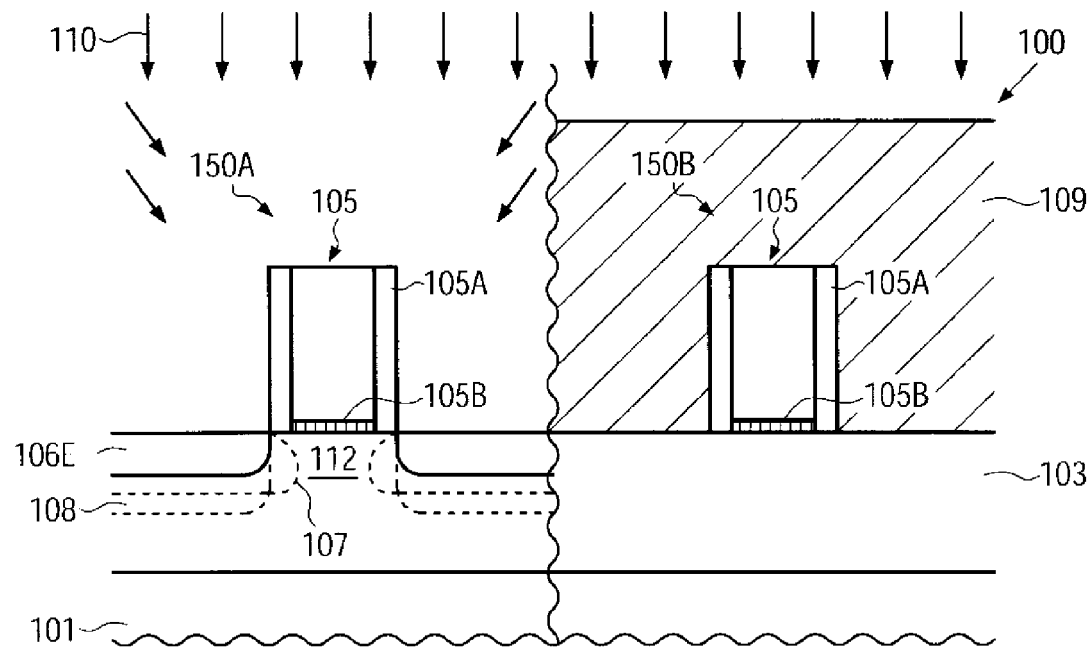
FIGS. 1a-1i schematically illustrate cross-sectional views of a semiconductor device including different transistors during various manufacturing stages in which a stress memorization approach is applied to two different transistor types which are in significantly different states with respect to the crystalline configuration of at least a portion of the drain and source regions, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein provides a method in which stress memorization techniques (SMT) may be efficiently applied during the manufacturing process for advanced transistor elements to achieve high selectivity of the stress memorization effect for one type of transistor, such as N-channel transistors or any other transistors requiring a high tensile strain in the channel regions thereof. It should be appreciated that, in the context of the present disclosure, a stress memorization technique is to be understood as a process in which a semiconductor region that may comprise a heavily damaged portion or a substantially amorphized portion may be annealed at temperatures that are sufficient to appropriately rebuild the respective crystalline structure, for instance, by re-crystallizing the amorphized portion in the presence of a overlying material layer in order to obtain a strained lattice structure. That is, a corresponding anneal process is performed in the presence of a cap layer that provides appropriate stress conditions in the semiconductor material in order to enable the creation of a strained state of the semiconductor material during the anneal process, wherein the strained state may be maintained in a more or less pronounced degree when the corresponding cap layer is removed partially or completely. It is to be appreciated that the respective mechanisms for creating a strained semiconductor material on the basis of these memorization techniques may not be fully understood yet while nevertheless providing significant advantages with respect to transistor performance, in particular, when applied in a highly selective manner as will be explained later on in more detail. Without intending to restrict the present application to any theory, it is believed that a high degree of selectivity, for instance, between P-channel transistors and N-channel transistors, may be achieved by maintaining a high crystalline quality in the drain and source areas of one transistor type while re-crystallizing significant crystalline damage or even a substantially amorphized state in another type of transistor in the presence of the overlying rigid material, for instance, in the form of silicon nitride and the like. Consequently, based on the teaching disclosed herein, an efficient selectivity of the stress memorization effect may be accomplished on the basis of masking regimes that may be required for defining the drain and source regions of different transistor types without requiring additional lithography steps, while also maintaining the number of additional deposition and removal processes at a low level. Thus, compared to many other approaches in which the selectivity of the stress memorization technique is achieved on the basis of patterning the rigid material layer prior to performing the anneal process, reduced process complexity and thus enhanced throughput in combination with high production yield may be achieved by avoiding additional lithography steps and reducing the number of deposition and patterning steps.

FIG. 1a schematically illustrates a semiconductor device 100 comprising a substrate 101, which may have formed thereon a semiconductor layer 103, such as a silicon-based semiconductor layer, which may be understood as a semiconductor material comprising a significant amount of silicon while other atomic species may also be present, such as germanium, carbon or any other semiconductor alloys, dopants and the like. For instance, the semiconductor layer 103 may include approximately 50 atomic percent silicon or more when averaged over the entire volume of the layer 103. It should be appreciated that, in some illustrative embodiments, the semiconductor layer 103 may represent an upper portion of the substrate 101, thereby providing a "bulk" configuration, while, in other embodiments, a buried insulating layer (not shown) may be provided between the semiconductor layer 103 and a base material of the substrate 101, thereby providing a silicon-on-insulator (SOI) configuration. In other cases, the semiconductor device 100 may comprise SOI portions and bulk portions within a single die region, depending on the overall device requirements. A first transistor 150A and a second transistor 150B may be formed in and above the semiconductor layer 103, wherein the transistors 150A, 150B may represent transistors of different conductivity type which may be provided adjacent to each other or which may be formed in different areas, such as logic blocks, memory blocks and the like.

In some illustrative embodiments, the first transistor 150A may represent a transistor in which a stress memorization technique should be avoided or at least the effect thereof should be reduced, while the second transistor 150B may represent a transistor exhibiting enhanced performance when a stress memorization technique is applied. For a standard crystallographic orientation of the semiconductor layer 103, that is, for a (100) surface orientation, and with the transistor length direction, i.e., in FIG. 1a, the horizontal direction, oriented along a <110> crystal direction or equivalent direction, a performance gain may be obtained for N-channel transistors in applying a stress memorization technique since it is believed that a tensile strain is generated in the respective channel region. On the other hand, a P-channel transistor may suffer from performance loss if a corresponding stress memorization technique is applied to both transistors 150A, 150B when provided in the form of a P-channel transistor and an N-channel transistor, respectively. It should also be appreciated that the transistors 150A, 150B may have a different configuration, for instance, with respect to transistor dimensions wherein, for convenience, any such differences in configuration are not shown in FIG. 1a.

The transistors 150A, 150B may comprise a gate electrode structure 105 which may be comprised of any appropriate material, such as polysilicon and the like, wherein, in some approaches, the gate electrode structure 105 may also represent a place holder structure which may be replaced by a highly conductive metal-containing material in a later manufacturing stage. The gate electrode structure 105 may comprise sidewall spacers 105A, which may also be referred to as offset spacers, which may have a thickness as considered appropriate for defining a desired lateral dopant profile in the semiconductor layer 103. Furthermore, the gate electrode structure 105 may include a gate insulation layer 105B which may have an appropriate thickness and material composition as required for the transistors 150A, 150B. For instance, the gate insulation layer 105B in this manufacturing stage may be provided in the form of an silicon oxide based material or may represent a high-k dialectic material, while in other cases the layer 105B may be removed in a later manufacturing stage and may be replaced by any appropriate dielectric material. Furthermore, in the manufacturing stage shown, the transistor 150A may comprise a shallow drain and source region 106E, which also may be referred to as an extension region, while a halo region 107 and a substantially amorphized portion 108 may also be provided, depending on the device requirements. On the other hand, the transistor 150B, which may be covered by an implantation mask 109, may be in a substantially crystalline state without respective dopants except for well implants and the like.

The semiconductor device 100 as shown in FIG. 1a may be formed on the basis of the following processes. The gate electrode structures 105 may be formed on the basis of deposition techniques and/or oxidation followed by the deposition of an appropriate gate electrode material which may then be patterned by using well-established lithography and etch techniques. If required, the spacers 105A may be formed by, for instance, deposition and/or oxidation followed by an appropriate etch process. Thereafter, the implantation mask 109 may be formed on the basis of well-established masking regimes as are typically required for forming transistors of different conductivity type. Thereafter, an implantation sequence 110 may be performed to define the substantially amorphized portion 108, if required, and the shallow drain and source regions 106E, while usually a tilted implantation sequence may be performed in defining the halo regions 107. In this respect, the halo regions 107 may represent implantation regions receiving an increased dopant concentration of the same conductivity type as is present in a channel region 112 so as to enable the control of the characteristics of a corresponding PN junction defined between the drain and source regions 106E and the channel region 112 thereby also providing control of short channel effects. It should be appreciated that different types of halo regions may be required, for instance, for transistors of the same conductivity type which may, however, have a different transistor performance, for instance, with respect to threshold voltage and the like. A respective sequence in which different halo regions are provided will be explained with reference to FIGS. 2a-2h later on.

After the implantation sequence 110, the transistor 150A is heavily damaged, which is considered inappropriate for the transistor 150A since the effects of a stress memorization technique should be reduced or be substantially completely avoided. Thus, according to one illustrative embodiment, a substantially crystalline state may be rebuilt in the transistor 150A prior to applying a stress memorization technique.

Figure 1B:
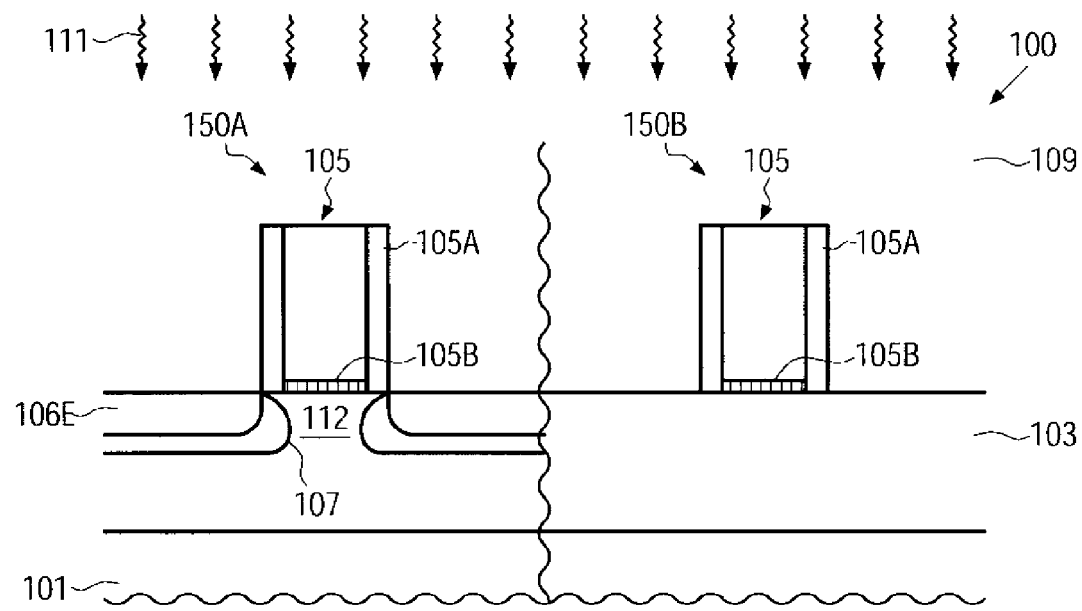

FIG. 1b schematically illustrates the semiconductor device 100 after the removal of the implantation mask 109, wherein the device 100 is subjected to an anneal process 111. In one illustrative embodiment, the anneal process 111 may be performed on the basis of a relatively low temperature in the range of approximately 550-700° C., while, in some cases, a temperature of approximately 550-650° C. is applied. In this case, dopant diffusion in the shallow drain and source regions 106E and the halo region 107 is maintained at a moderately low level while nevertheless an efficient re-crystallization of the damaged semiconductor material may be accomplished. In other cases, the anneal process 111 may comprise a process performed at very short anneal times, for instance, on the basis of laser radiation or flash light pulses, wherein an effective annealing of the exposed surface portion is accomplished within several milliseconds and even less. In these cases, dopant activation and re-crystallization may be achieved substantially without significant dopant diffusion. In other cases, the anneal process 111 may comprise a low temperature anneal process, possibly in combination with a laser based or flash based short radiation anneal process. In still other embodiments, conventional rapid thermal anneal (RTA) techniques or advanced flash light and/or laser based techniques may be used with any appropriate anneal temperature. Thus, after the anneal process 111, the shallow drain and source regions 106E and the halo region 107 may be in a substantially crystalline state. It should be appreciated that respective crystalline defects may still be present, however, at a significantly reduced amount compared to the state as shown in FIG. 1a.

Figure 1C:
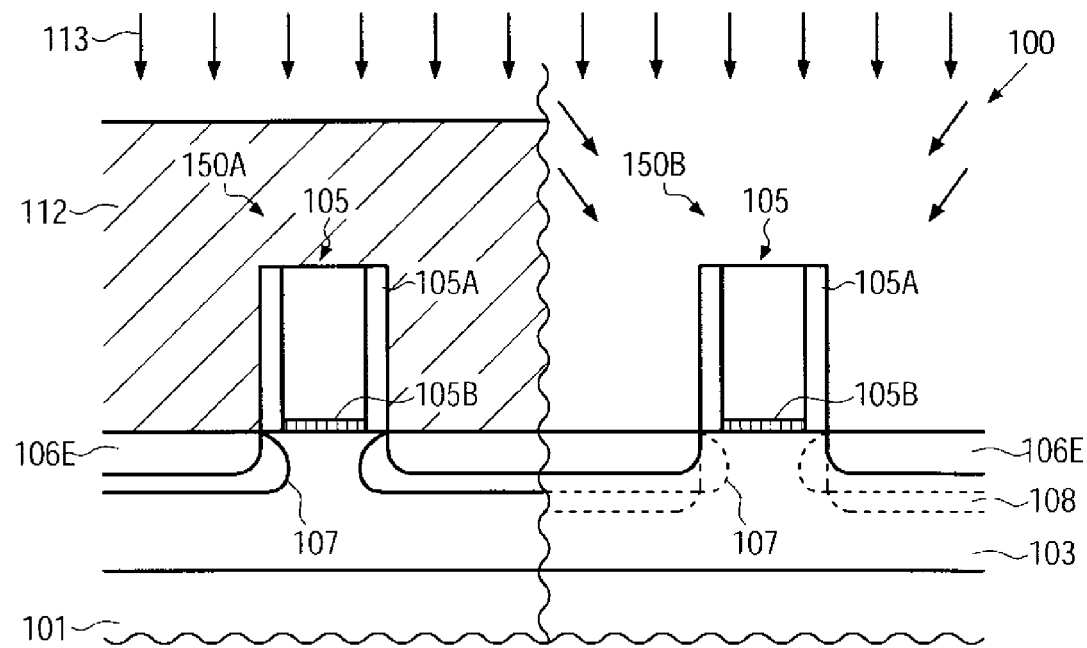

FIG. 1c schematically illustrates the semiconductor device 100 in a further advanced manufacturing stage. As shown, the device 100 may comprise a further implantation mask 112 that covers the first transistor 150A while exposing the second transistor 150B. Furthermore, the device 100 may be subjected to a further ion implantation sequence in order to form shallow drain and source regions or extension regions 106E, halo regions 107 and a substantially amorphized portion 108, where the respective implantation parameters and the dopant species may be selected so as to comply with the requirements for the transistor 150B. After the implantation sequence 113, the transistor 150B may be in a highly damaged state with respect to the drain and source areas and the gate structure, wherein, in some illustrative embodiments, a material layer may be formed after removal of the implantation mask 112 in order to perform a heat treatment to re-crystallize the damaged portions in the transistor 150B in the presence of the material layer, as will also be described later on in more detail. Thus, in this case, a highly strained state may be achieved in the channel region of the transistor 150B while the transistor 150A may remain in its substantially crystalline state without creating additional strain therein.

In other illustrative embodiments, the semiconductor device 100 may receive a spacer material, such as silicon nitride, possibly in combination with an appropriate liner material, such as silicon dioxide, in order to act as an efficient etch stop material during a subsequent anisotropic etch process for forming respective sidewall spacer elements.

Figure 1D:
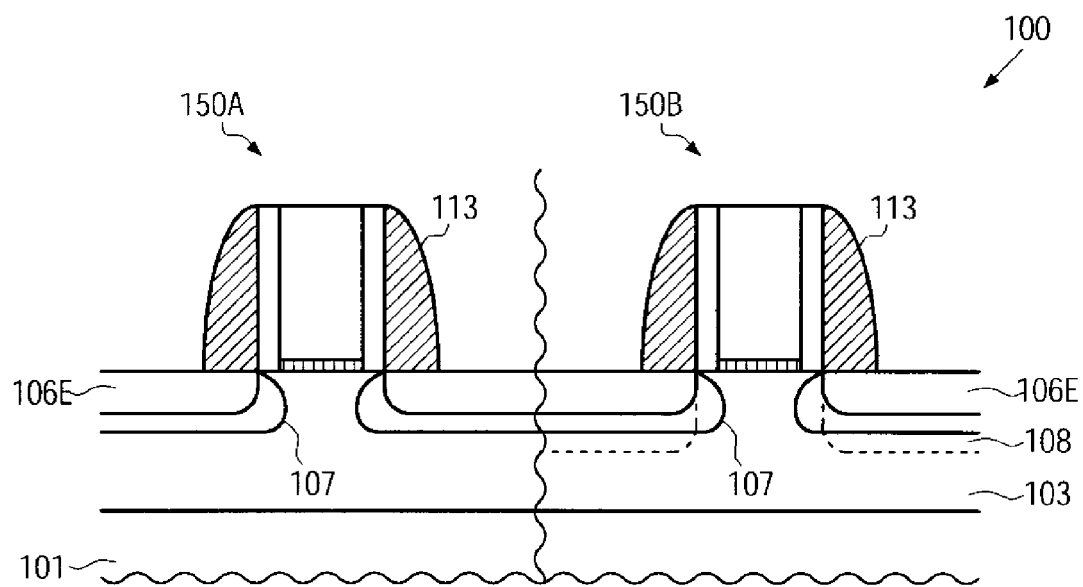

FIG. 1d schematically illustrates the semiconductor device 100 after the completion of the above-described process sequence. Hence, the transistors 150A, 150B may comprise respective sidewall spacer elements 113 which may have a lateral width as required for defining respective deeper portions of the drain and source regions of the transistors 150A, 150B.

Figure 1E:
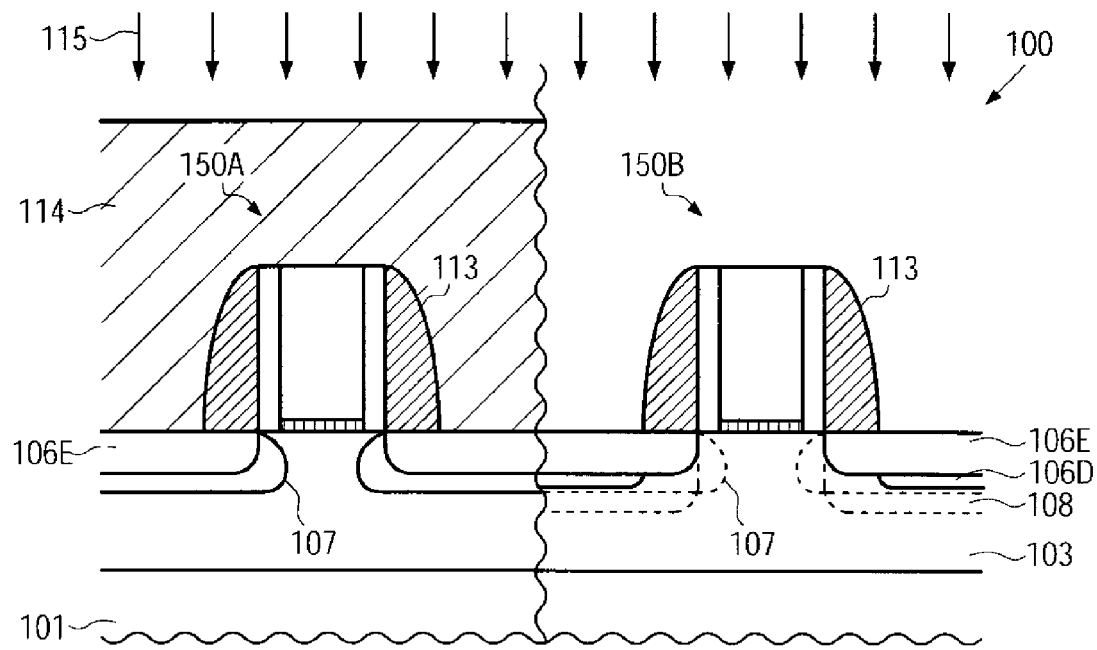

FIG. 1e schematically illustrates the semiconductor device 100 in a further advanced manufacturing stage in which a further implantation mask 114 covers the transistor 150A while the second transistor 150B is exposed to a further implantation process 115 for defining a deeper drain and source portion 106D. In the embodiment shown, the deeper drain and source portion 106D may be formed within the substantially amorphized portion 108, thereby providing moderately uniform implantation conditions due to reduced channeling effects. In other cases, when the substantially amorphized portion 108 may not extend to the depth as required for the portion 106D, the implantation process 115 may itself create an amorphizing effect, in particular, when heavy N-type dopant species are introduced. In this case, the implantation 115 may contribute to additional crystalline damage, which may be advantageous with respect to the subsequent stress memorization process. Consequently, after the implantation process 115, heavy crystalline damage may be obtained while nevertheless providing high process uniformity during the definition of the deeper drain and source portion 106D.

Figure 1F:
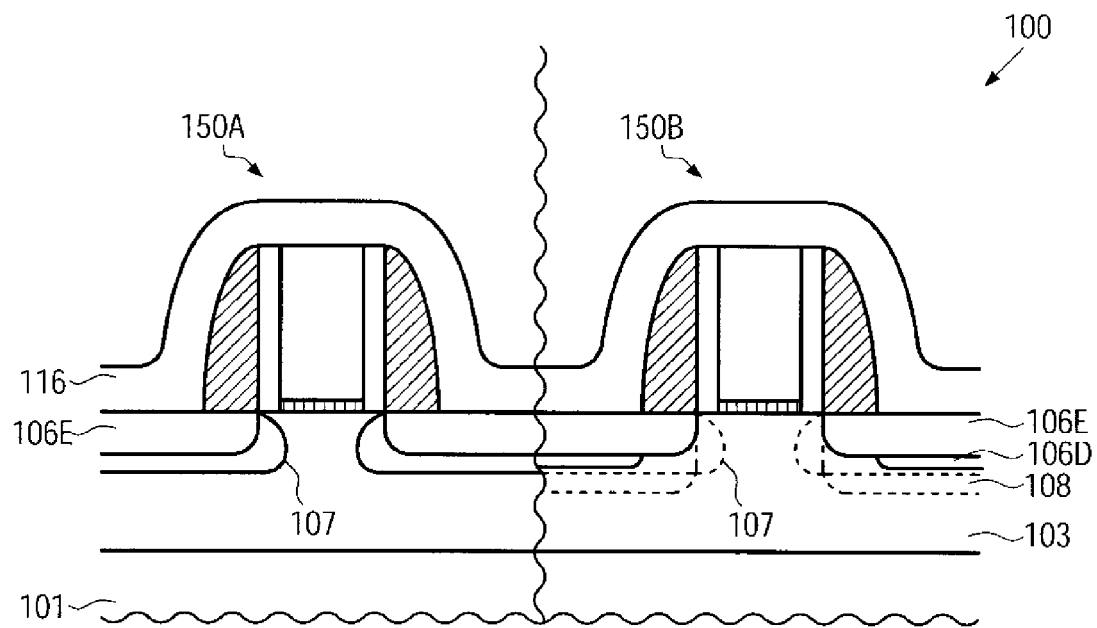

FIG. 1f schematically illustrates the device 100 with a material layer 116 formed above the first and second transistors 150A, 150B. The layer 116 may be comprised of a rigid material, such as silicon nitride, silicon carbide and the like, which may act as a rigid cap layer in order to substantially prevent a reduction in volume of the highly damaged semiconductor material in the second transistor 150B. In some illustrative embodiments, the layer 116 may comprise a liner material (not shown) having a high etch selectivity with respect to a main portion of the layer 116 in order to enhance the subsequent removal of the layer 116. For instance, a thin silicon dioxide layer may be provided in combination with silicon nitride for which well-established highly selective etch recipes may be available. In other illustrative embodiments, the layer 116 may be provided as silicon nitride material with an appropriate thickness, for instance, in the range of approximately 10-15 nm.

Figure 1G:
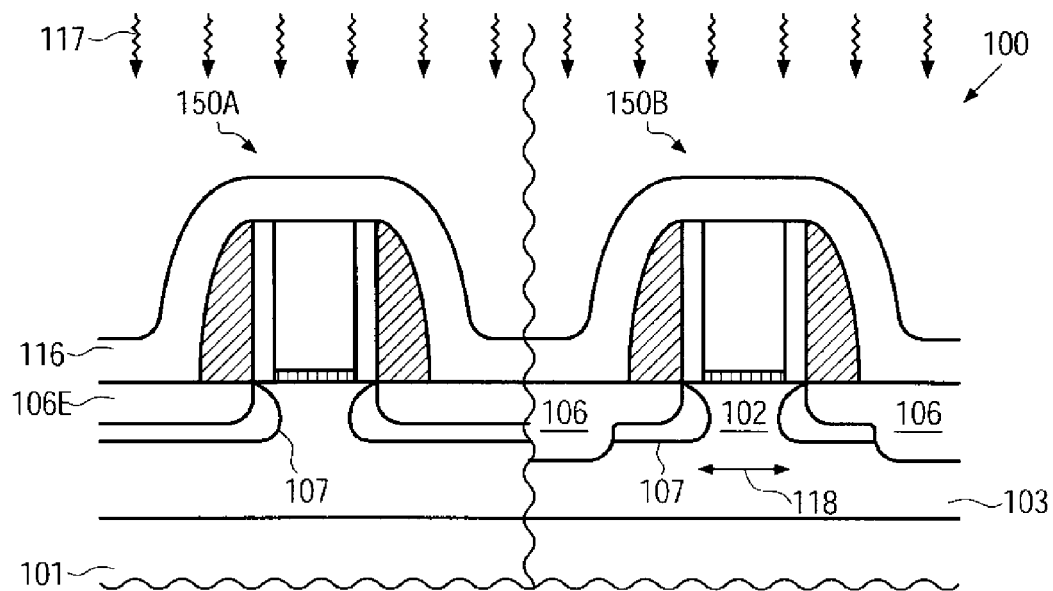

FIG. 1g schematically illustrates the semiconductor device 100 during an anneal process 117 during which the semiconductor material in the second transistor 150B may substantially re-crystallize. For instance, the anneal process 117 may be performed on the basis of temperatures ranging from approximately 550-750° C. or, in other illustrative embodiments, a temperature range of 550-650° C. may be used. In other embodiments, the anneal temperature may be selected to any other appropriate values, which may be higher than the before mentioned values. Thus, drain and source regions 106 may be obtained in a highly crystalline state which may form respective PN junctions with the re-crystallized halo regions 107, while the drain and source regions 106, the halo region 107 and the remaining previously amorphized portions 108 may re-grow in a tensile-strained state in the transistor 150B thereby also exerting a respective stress to the channel region 102 which may therefore create the respective desired tensile strain 118. On the other hand, the first transistor 150A may substantially remain in its crystalline state without experiencing significant additional strain effects except for any other strain-inducing sources which may have previously been incorporated into the transistor 150A, such as an embedded strain-inducing material, for instance, in the form of a silicon/germanium alloy and the like.

Thereafter the material layer 116 may be removed on the basis of any appropriate etch recipe wherein, in some illustrative embodiments, well-established techniques may be used when, for instance, an appropriate etch stop material may be provided. In other cases, the material layer 116 may be removed on the basis of an etch process that is selective with respect to the gate electrode structure 105 and the material of the semiconductor layer 103. If, for instance, the sidewall spacer elements 113 and the layer 116 are comprised of substantially the same material, such as silicon nitride, a respective material removal in the spacers 113 may be acceptable, since the removal process may be highly controllable while also a moderately low thickness may have to be removed so that the material of the layer 116 may be removed with high uniformity from horizontal and vertical portions of the device 100. In other cases, the spacer elements 113 may be formed of a different material, such as silicon dioxide, and silicon nitride material may be efficiently removed selectively to the gate electrode structure 105, the semiconductor layer 103 and the spacer elements 113.

Figure 1H:
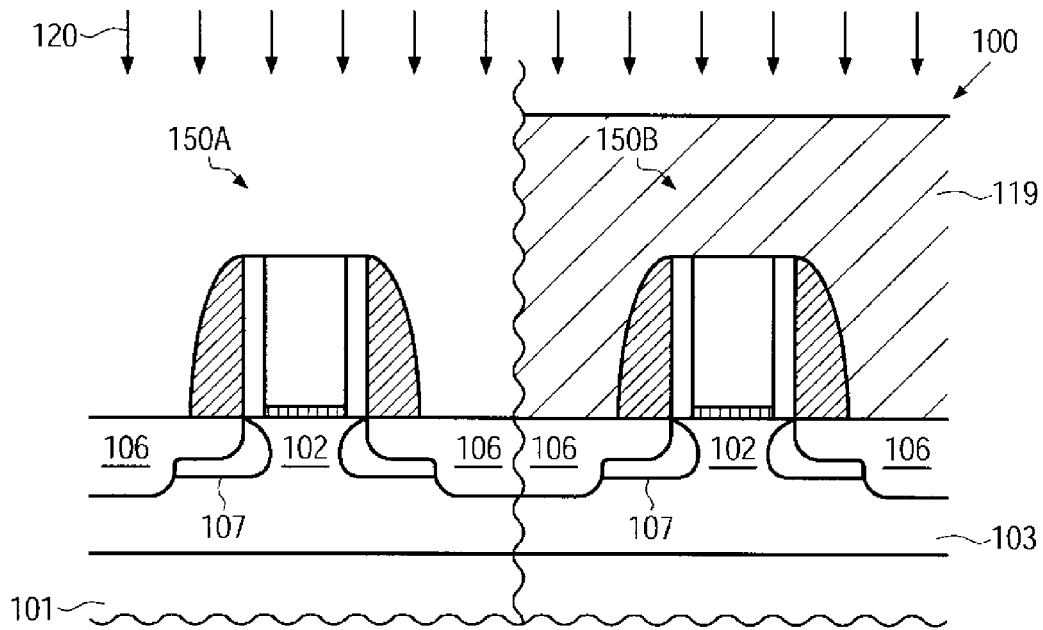

FIG. 1h schematically illustrates the semiconductor device 100 in a further advanced manufacturing stage in which a further implantation mask 119 may be provided in accordance with well-established masking regimes so as to expose the transistor of 150A to a further implantation process 120 designed to define a deeper drain and source portion 106 in the transistor 150A.

Figure 1I:
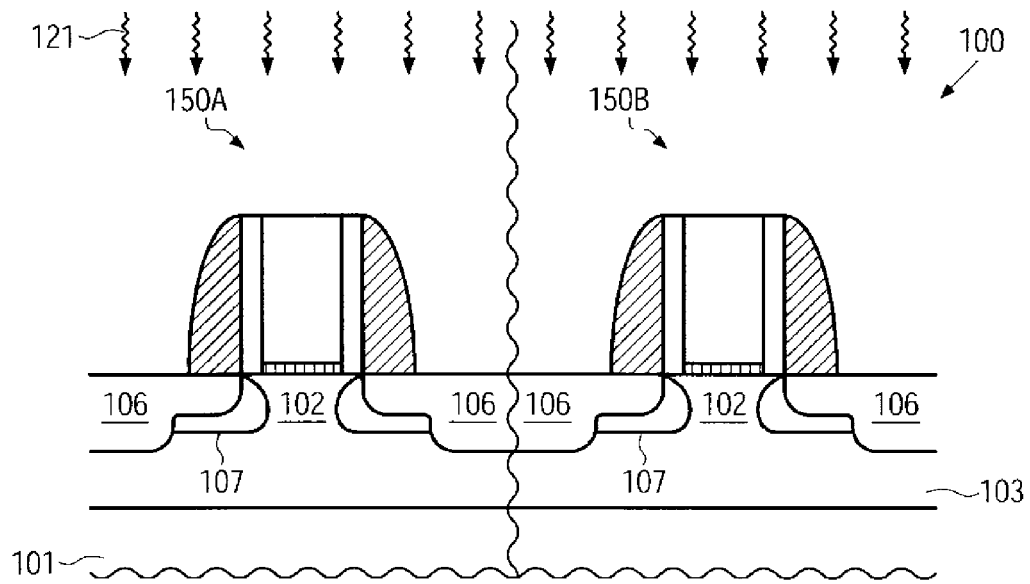

FIG. 1i schematically illustrates the semiconductor device 100 during a further anneal process 121 designed to activate the dopants of the deeper drain and source portions 106 and also to re-crystallize implantation-induced damage. In some illustrative embodiments, the anneal process 121 may be performed on the basis of a radiation of short duration, for instance, as a laser-based or flash-based anneal process, in which moderately high temperatures are generated within very short time intervals of milliseconds and significantly less, thereby substantially avoiding any pronounced diffusion activity. Thus, the dopant profile previously established in the first and second transistors 150A, 150B may be substantially maintained while additionally providing enhanced activation in the second transistor 150B and also in the previously re-crystallized drain and source portions and halo regions 106 and 107 of the first transistor 150A. In some illustrative embodiments, the drain and source regions 106 of the first and second transistors 150A, 150B may represent the final configuration of the drain and source regions without requiring any additional lateral or vertical profiling thereof. Thus, the device 100 may be subjected to further process steps such as forming metal silicide regions in the drain and source regions 106 and the gate electrode structure 105 if required, followed by the deposition of an appropriate interlayer dielectric material which may also comprise a highly stressed portion, possibly differently stressed for the transistors 150A, 150B in order to further enhance the overall transistor performance.

Figure 1J:
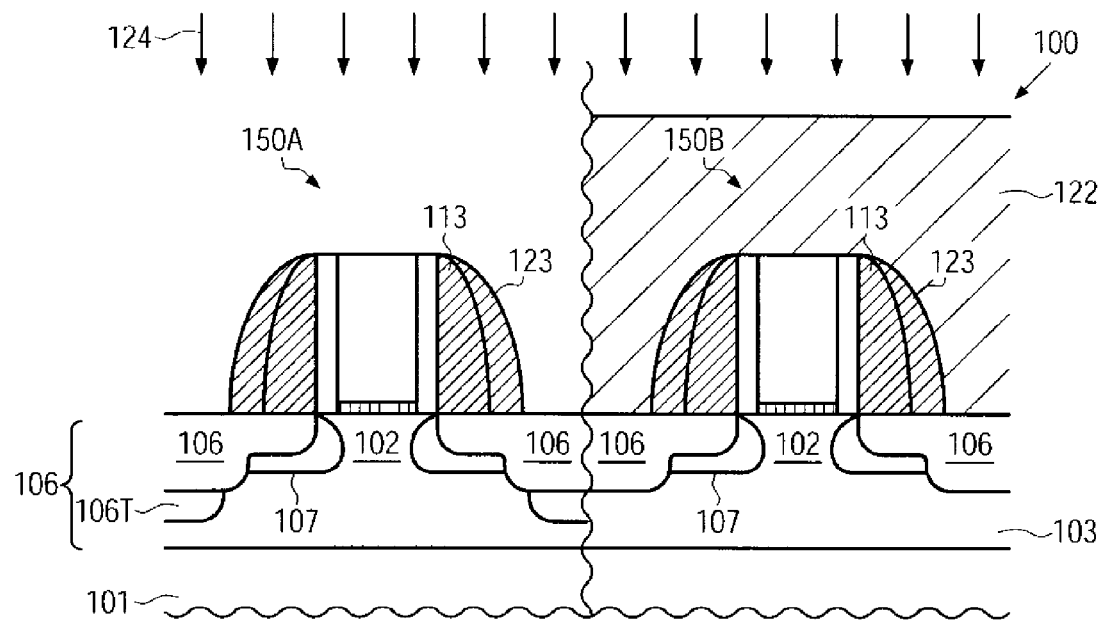
FIGS. 1j-1k schematically illustrate cross-sectional views of the semiconductor device in advanced manufacturing stages where more pronounced lateral dopant profiles on the basis of additional spacer elements is required, according to still further illustrative embodiments.
Figure 1K:
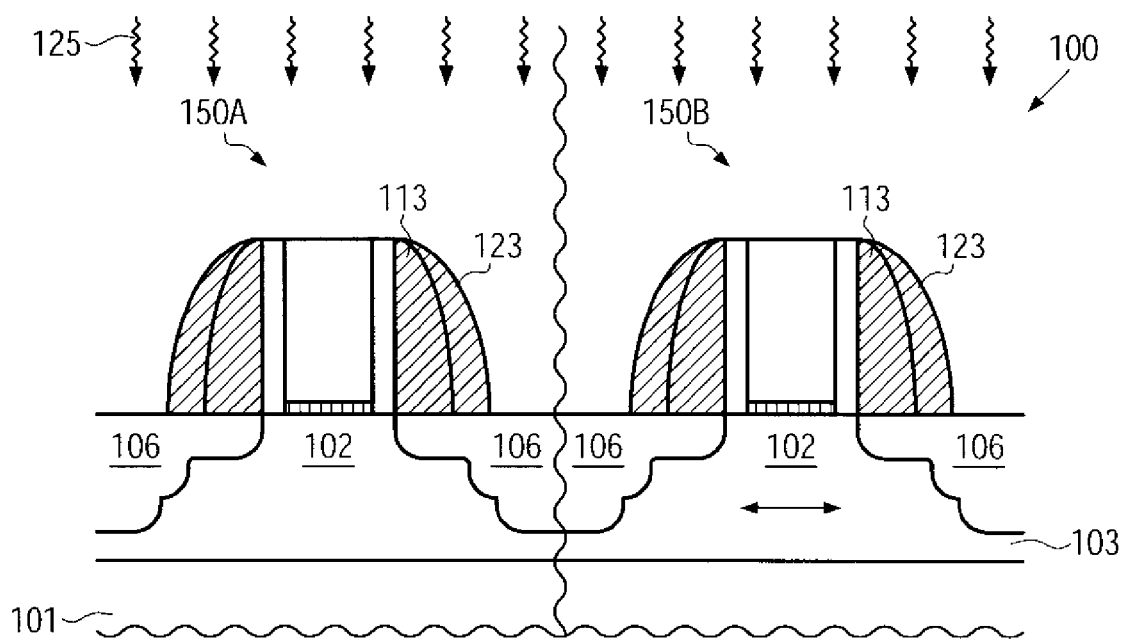

With reference to FIGS. 1j-1k, further illustrative embodiments will now be described in which the lateral profiling of the drain and source regions 106 may require an additional spacer element and a further implantation process.

FIG. 1j schematically illustrates the semiconductor device 100 in an advanced manufacturing stage in which further sidewall spacer elements 123 may be formed adjacent to previously formed spacer elements 113. Furthermore, an additional implantation mask 122 may be provided to cover one of the transistors 150A, 150B. In the embodiment shown, the transistor 150B may be covered and the transistor 150A may be exposed to a further implantation process 124 thereby defining a further deep drain and source portion 106T which, in combination with the previously created portions 106E, 106D, may now define the drain and source regions 106. Thereafter, the implantation mask 122 may be removed and a further implantation mask may be provided to cover the transistor 150A while exposing the transistor 150B to a further implantation process for introducing an appropriate dopant species to also define a further deep drain and source portion in the transistor 150B.

FIG. 1k schematically illustrates the semiconductor device 100 wherein a further anneal process 125 is performed in order to obtain the drain and source regions 106 having a pronounced lateral and vertical dopant profile as obtained on the basis of the spacers 113 and 123. It should be appreciated that, in the embodiments described with reference to FIGS. 1j-1k, the anneal process 121 (FIG. 1i) may be omitted if deemed appropriate, since activation and re-crystallization for the preceding implantation process 120 may be accomplished during the anneal process 125. With respect to any process parameters of the anneal process 125, substantially the same criteria apply as previously explained with reference to the anneal process 121.

Thus, the transistor 150B may be formed with tensile strain while substantially not affecting the strain condition of the transistor 150A. Furthermore, the selective stress memorization approach may be accomplished on the basis of a masking regime without adding additional lithography and spatially selective patterning steps. Furthermore, except for the deposition of the layer 116, and the removal thereof, which may also be accomplished without selective patterning regimes, substantially no additional process steps may be added.

With reference to FIGS. 2a-2h, further illustrative embodiments will now be described in which a plurality of transistor elements of the same conductivity type with different configuration may be selectively subjected to a stress memorization technique, while a plurality of transistors of a different connectivity type with different configurations may substantially not be affected by the stress memorization process.

Figure 2A:
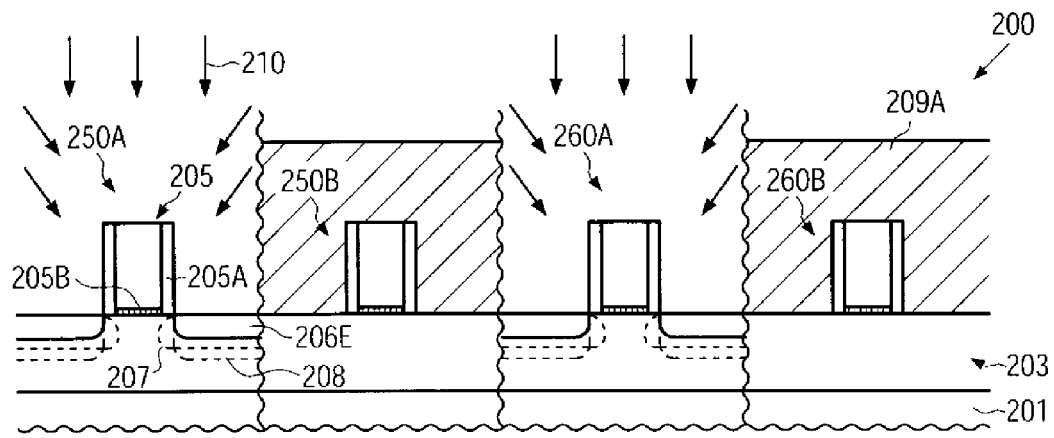
FIGS. 2a-2h schematically illustrate cross-sectional views of a semiconductor device including transistor elements of different conductivity type and different configuration during various manufacturing stages in which implantation and anneal processes are appropriately positioned in the manufacturing flow to obtain a highly crystalline state in one type of transistor while providing heavy damage in the other type of transistor prior to annealing the devices in the presence of a rigid material layer, according to still further illustrative embodiments.

FIG. 2a schematically illustrates a semiconductor device 200 comprising a substrate 201 and a semiconductor layer 203 for which the same criteria may apply as previously explained with reference to the components 101 and 103. In the manufacturing stage shown, a first plurality of transistors 250A, 260A may be formed in and above the semiconductor layer 203. The transistors 250A, 260A may represent the same conductivity type, for instance, P-channel transistors, while requiring a different configuration, for instance, with respect to threshold voltage and the like. For instance, the transistor 250A may represent a P-channel transistor in a logic block, whereas the transistor 260A may be part of a memory block which may require different threshold voltages compared to high performance transistors in a logic block. Similarly, a second plurality of transistor elements 250B, 260B may be provided which may represent N-channel transistors of different configurations. Similarly, the transistor 150B may represent a part of a logic block requiring, for instance, a different threshold voltage compared to the transistor 260B. The first and second transistors, which may collectively be noted as transistors 250, 260 may each comprise a gate electrode structure 205 which may include a spacer element 205A and a gate insulation layer 205B. With respect to these components, the same criteria apply as previously explained with reference to the device 100. Furthermore, the device 200 may comprise an implantation mask 209A exposing the transistors 250A, 260A, while covering the transistors 250B, 260B. The device 200 may be subjected to an implantation sequence 210 designed to create a shallow drain and source region 206E, an amorphized portion 208 and a halo region 207 appropriate for the transistor 250A. Similarly, these implantation regions may also be defined in the transistor 260A, wherein it may be assumed that at least the halo region may require an increased dopant concentration so as to appropriately adjust performance of the transistor 260A due to its different configuration.

Figure 2B:
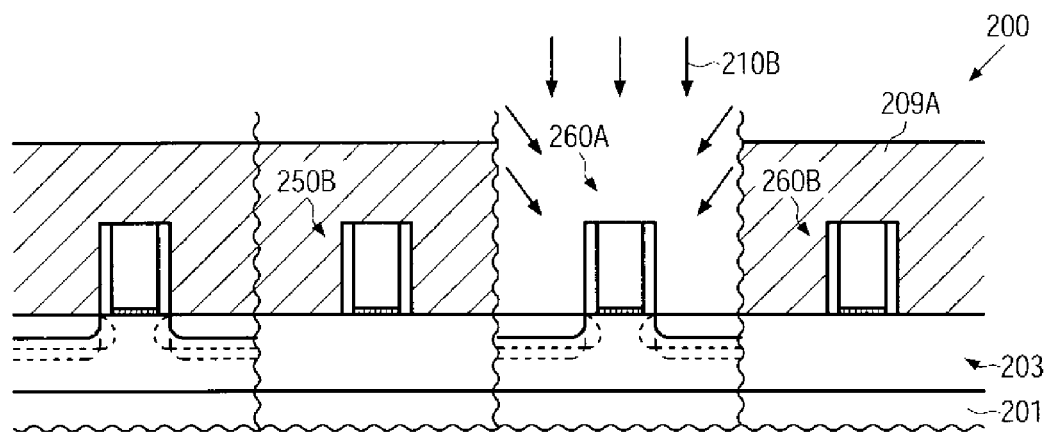

FIG. 2b schematically illustrates the semiconductor device 200 with an appropriately designed implantation mask 209A which covers the transistors 250A, 250B and 260B while exposing the transistor 260A. During a further halo implantation 210B, the shape and concentration of the halo region 207 in the transistor 260A may be defined as required for desired operational behavior of this transistor.

Figure 2C:
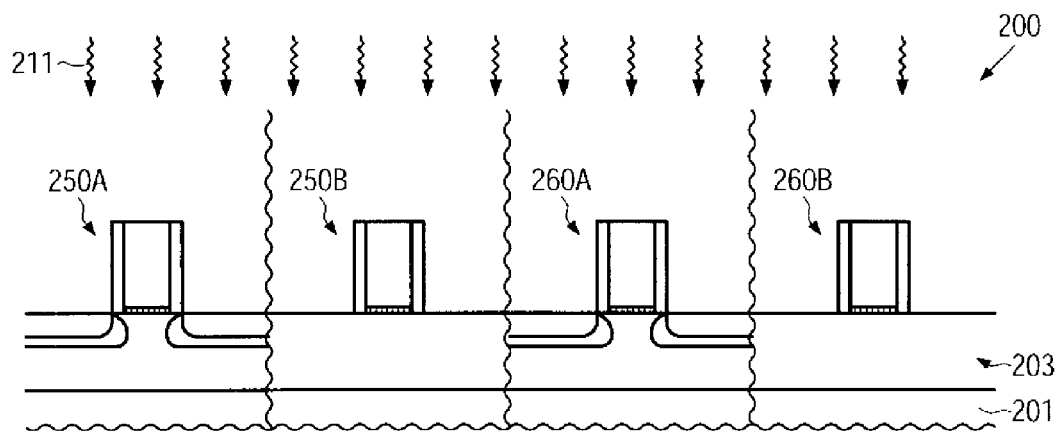

FIG. 2c schematically illustrates the semiconductor device 200 after the removal of the implantation mask 209A and during an anneal process 211 for reducing any implantation-induced damage in the first transistors 250A, 260A. For the anneal process 211, the same criteria apply as previously explained with reference to the anneal process 111.

Figure 2D:
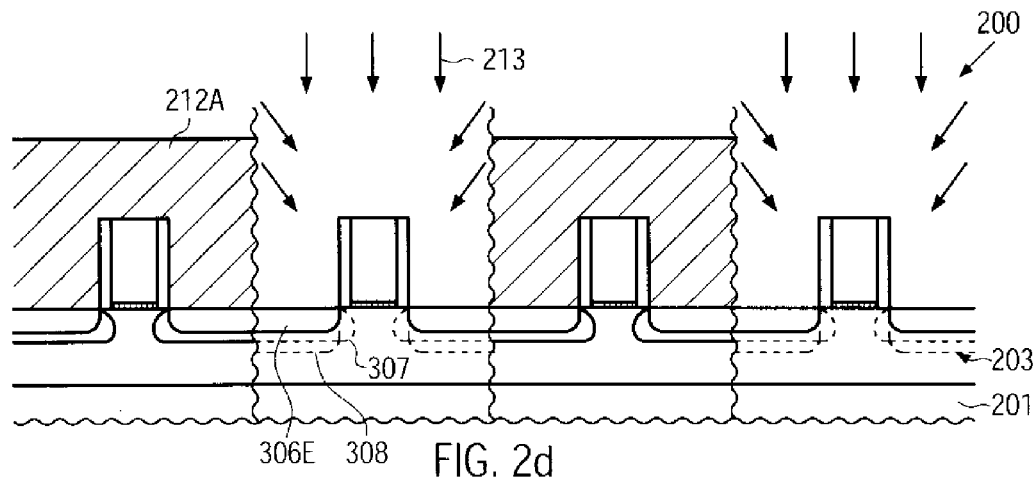

FIG. 2d schematically illustrates the semiconductor device 200 with a further implantation mask 212A configured to expose the transistors 250B, 260B while covering the transistors 250A, 260A, which are in a substantially crystalline state after the anneal processes 211. During the implantation process 213, respective shallow drain and source regions 306E, amorphized portions 308 and halo regions 307 may be defined wherein, in this case, the respective halo region 307 is designed so as to be appropriate for the transistor 250B, while the transistor 260B may require a higher concentration in the halo region 307, which may be accomplished by a subsequent implantation process.

Figure 2E:
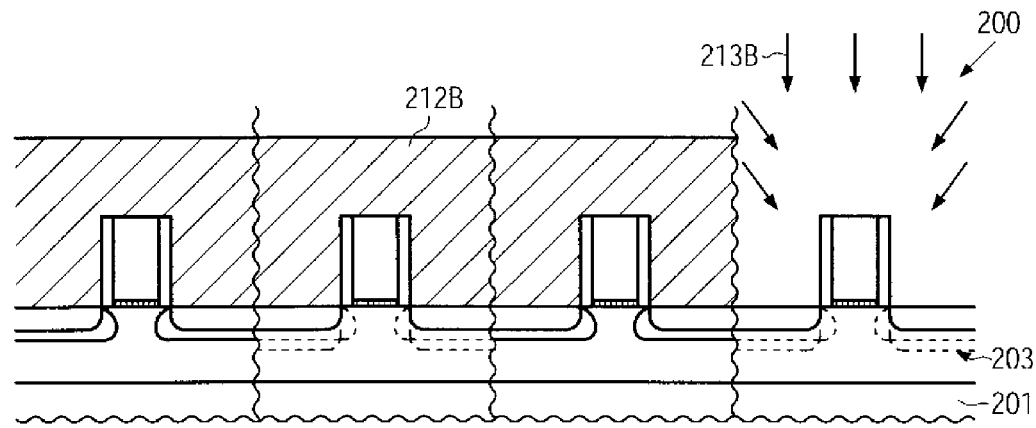

FIG. 2e schematically illustrates the semiconductor device 200 with a further implantation mask 212B covering the transistors 250A, 250B, 260A, while exposing the transistor 260B to a further implantation process 213B, thereby obtaining the desired halo shape and concentration in this transistor.

Figure 2F:
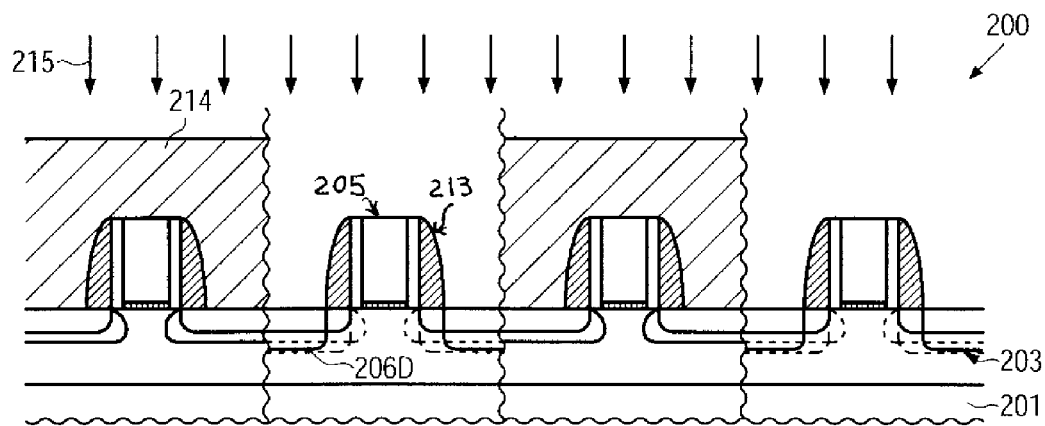

FIG. 2f schematically illustrates the semiconductor device 200 in a further advanced manufacturing stage in which respective sidewall spacers 213 may be formed on sidewalls of the gate electrode structures 205 and wherein a further implantation mask 214 may be provided to cover the first transistors 250A, 260A while exposing the second transistors 250B, 260B. During a further implantation process 215, deeper drain and source portions 206D may be defined, thereby further increasing implantation-induced damage if the previously formed amorphized portions 308 may not extend down to the depth of the deeper drain and source portion 206D.

Figure 2G:
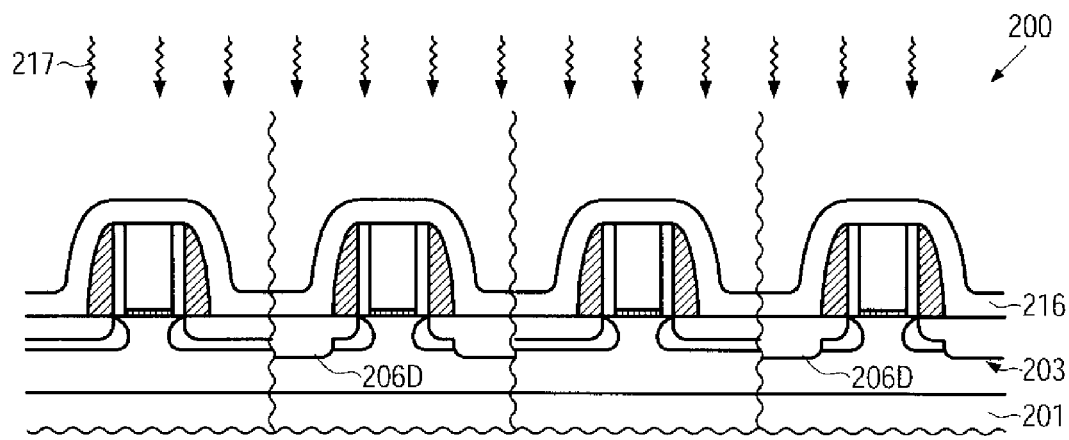

FIG. 2g schematically illustrates the semiconductor device 200 in a further advanced manufacturing stage in which a sacrificial material layer 216, for instance in the form of silicon nitride, possibly in combination with an etch stop material and the like, may be formed above the transistors 250, 260. Furthermore, an anneal process 217 may be performed to re-crystallize implantation-induced damage in the transistors 250B, 260B, thereby also generating a respective strain in the channel regions, as is previously explained. On the other hand, the transistors 250A, 260A may remain in a substantially crystalline state, except for experiencing an additional anneal cycle by the anneal process 217. However, as previously explained, the anneal process 217 may be performed on the basis of process parameters that may avoid undue dopant diffusion in the transistors 250A, 260A.

Figure 2H:
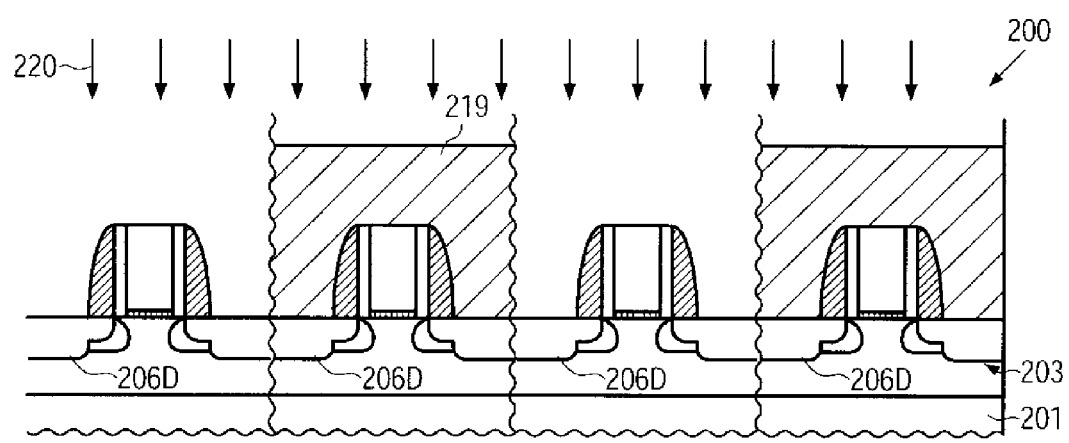

FIG. 2h schematically illustrates the semiconductor device 200 in a further advanced manufacturing stage, i.e., after the removal of the sacrificial layer 216, which may be accomplished on the basis of the same processes as previously described, and with a further implantation mask 219 covering the transistors 250B, 260B. During a further implantation process 220, the deep drain and source portion 206D may be defined in the first transistors 250A, 260A. wherein the deep drain and source portions 206D, in combination with their shallow drain and source regions 206E, may define the final drain and source regions, according to some illustrative embodiments. In other cases, additional implantation processes may be performed, for instance, on the basis of a further spacer element as is also previously described with reference to FIGS. 1j-1k.

Thus, for the embodiments described with reference to FIGS. 2a-2h, a selective application of the stress memorization technique may be accomplished without adding additional lithography processes while also enabling the definition of sophisticated dopant profiles in the transistors 250A, 260A on the one hand and the transistors 250B, 260B on the other hand.

With reference to FIGS. 3a-3d, further illustrative embodiments will now be described in which a rigid material layer may be used as an implantation mask prior to performing a respective anneal process for re-crystallizing implantation-induced damage.

Figure 3A:
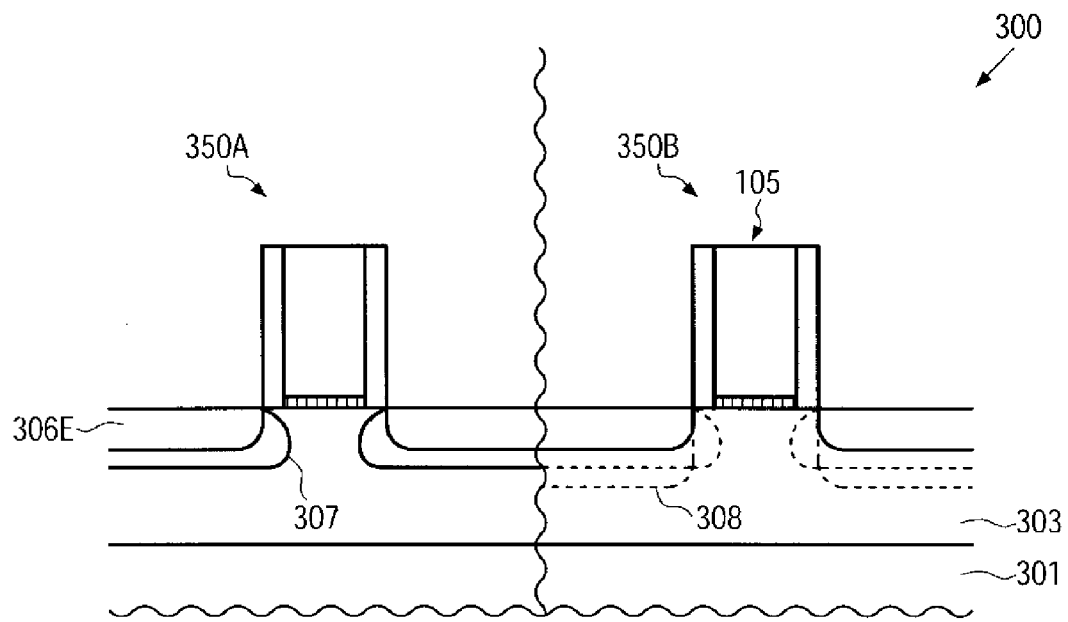
FIGS. 3a-3d schematically illustrate cross-sectional views of a semiconductor device including different transistor elements during various manufacturing stages in applying a sophisticated stress memorization technique wherein a non-patterned material layer may be used as an implantation mask, according to still further illustrative embodiments.

FIG. 3a schematically illustrates a semiconductor device 300 comprising a substrate 301 and a semiconductor layer 303 which may have the same configuration as previously described with reference to the device 100. Furthermore, a first transistor 350A and a second transistor 350B may comprise a gate electrode structure 105, for instance, including a spacer element and a gate insulation layer as is previously explained with reference to the devices 100 and 200. Moreover, in the manufacturing stage shown, the first transistor 350A may comprise shallow drain and source regions 306E, possibly in combination with a halo region 307 in substantially crystalline state. On the other hand, the second transistor 350B may comprise the shallow drain and source region 306E, the halo region 307 in a substantially amorphized or at least heavily damaged state, wherein an amorphized portion 308 may also be provided.

The semiconductor device 300 as illustrated in FIG. 3a may be formed on the basis of substantially the same process techniques as previously described with reference to the devices 100 and 200.

Figure 3B:
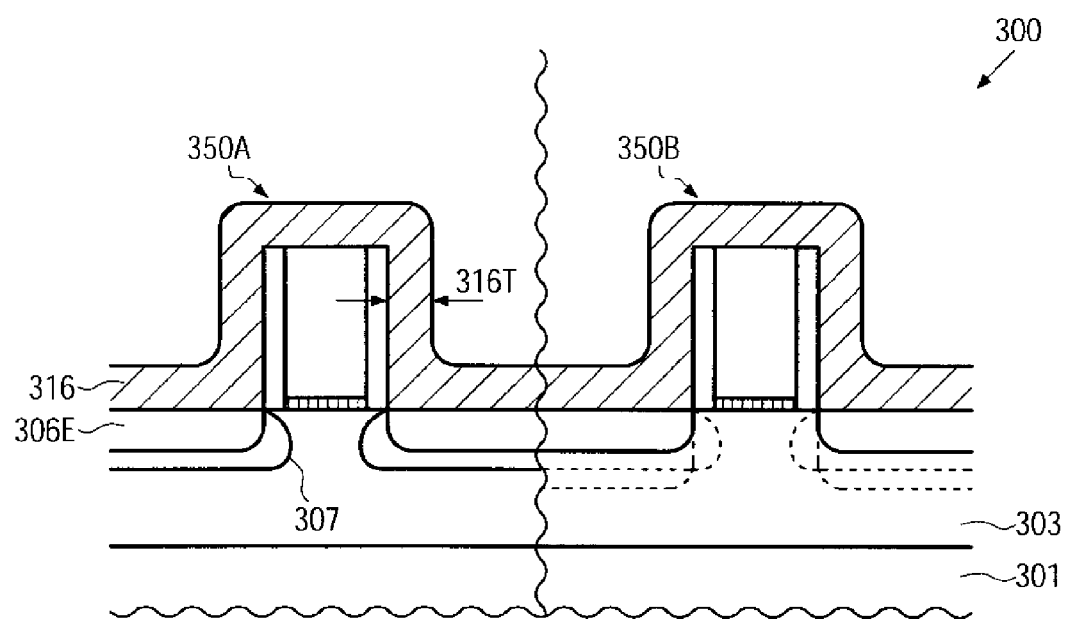

FIG. 3b schematically illustrates the semiconductor device 300 comprising a spacer layer 316 which may be comprised of any appropriate material, such as silicon nitride, possibly in combination with an etch stop liner (not shown) and the like. The spacer layer 316 may be formed with an appropriate thickness 316T so as to provide a desired offset for deeper drain and source portions to be formed in the first and second transistors 350A, 350B.

Figure 3C:
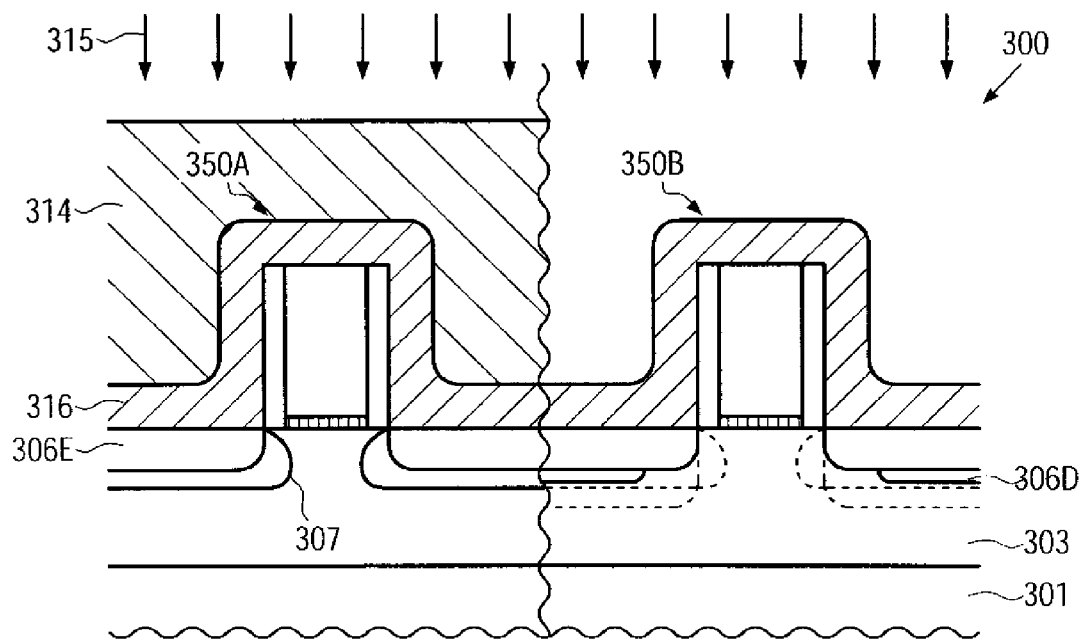

FIG. 3c schematically illustrates the semiconductor device 300 with an implantation mask 314 formed above the transistor 350A while exposing the transistor 350B, i.e., the exposed portion of the spacer layer 316, to an implantation process 315 for defining deep drain and source regions 306D.

The implantation process 315 may be performed on the basis of appropriately selected implantation parameters, for instance, with respect to implantation energy in order to obtain the desired penetration depth of the respective implantation species. For example, advanced transistor elements may require moderately shallow PN junctions which require increasingly reduced implantation energies which may finally result in a reduced implantation uniformity and throughput. In this case, the layer 316 may allow the use of higher implantation energy, thereby possibly improving throughput and implantation uniformity.

Figure 3D:
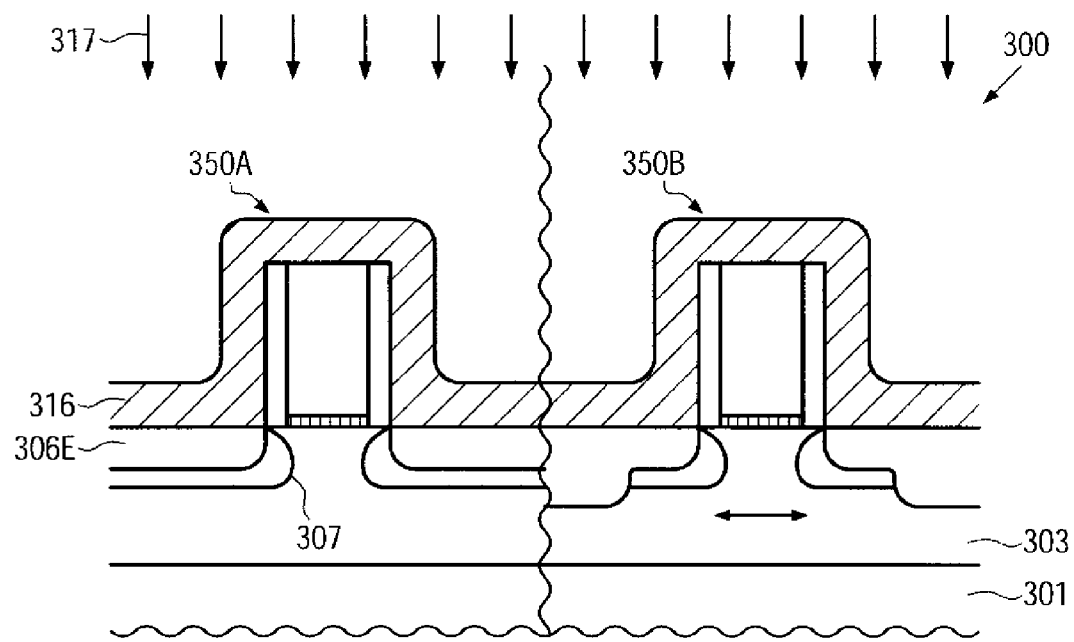

FIG. 3d schematically illustrates the semiconductor device 300 after the removal of the mask 314 and during an anneal process 317 in order to re-crystallize the heavily damaged portions in the transistor 350B in the presence of the spacer layer 316. Although the layer 316 may have been modified due to the particle bombardment during the implantation process 315, nevertheless, a sufficient rigidity may be maintained to provide the desired strain-inducing effect. After the anneal process 317, a further implantation mask may be formed to cover the transistor 350B while respective deep drain and source regions may be implanted into the transistor 350A through the layer 316. Depending on the device requirements, a further spacer layer may be deposited and may be patterned so as to obtain spacer elements of the required thickness, while, in other cases, the layer 316 may be patterned into spacer elements, which may be required for the formation of metal silicide regions. In still other illustrative embodiments, the spacer layer 316 may be removed and the further processing may be continued with, for instance, the formation of metal silicide regions, and respective highly stressed interlayer dielectric materials may be formed on the basis of the offset spacers 305A, thereby enhancing overall conductivity as well as stress transfer efficiency, since a respective stressed interlayer dielectric material may be positioned more closely to the channel regions.

As a result, the subject matter disclosed herein provides enhanced stress memorization approaches in which the strain-inducing mechanism may be selectively applied to transistors of a specific configuration or conductivity type while other transistors may be maintained in highly crystalline state during the strain-inducing anneal process, thereby enabling a high degree of selectivity without requiring additional lithography and masking steps. In this way, the performance of N-channel transistors may be enhanced while not substantially negatively affecting P-channel transistors. For instance, measurements have been carried out in which P-channel transistors and N-channel transistors have been subjected to a stress memorization approach without selectivity, which may result in a moderate performance enhancement of a respective semiconductor device. On the other hand, the same type of semiconductor device has been formed on the basis of the selective stress memorization approach described above, thereby obtaining an overall increase of device performance, for instance, with respect to DC performance and AC performance of several percent compared to the non-selectively processed semiconductor devices. Thus, enhanced device performance may be accomplished while not unduly contributing to the overall process complexity.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming drain and source extension regions of a P-channel transistor;
    annealing said P-channel transistor to provide said drain and source extension regions of said P-channel transistor in a substantially crystalline state;
    forming drain and source extension regions and at least a first portion of deep drain and source regions of an N-channel transistor after annealing said P-channel transistor and while maintaining said substantially crystalline state of said drain and source extension regions of said P-channel transistor;
    forming a material layer above said P-channel transistor and said N-channel transistor after forming said drain and source extension regions and said first portion of the deep drain and source regions of said N-channel transistor;
    re-crystallizing implantation-induced damage in said drain and source extension regions and said first portion of the deep drain and source regions of said N-channel transistor by annealing said P-channel transistor and said N-channel transistor in the presence of said material layer; and
    forming a second portion of said drain and source regions of said P-channel transistor after re-crystallizing said implantation-induced damage in said first portion of the drain and source regions of said N-channel transistor, said second portion being deeper than said drain and source extension regions of said P-channel transistor.

2. The method of claim 1, wherein forming said drain and source extension regions of said N-channel transistor comprises forming said shallow drain and source extension regions while masking said P-channel transistor, and the method further comprises:
    forming spacer elements on sidewalls of gate electrodes of said P-channel transistor and said N-channel transistor;
    forming said second portion of said drain and source regions of said P-channel transistor by implanting a P-type dopant species in the presence of said spacer elements; and
    forming a second portion of said deep drain and source regions of said N-channel transistor by implanting an N-type dopant species in said N-channel transistor in the presence of said spacer elements while masking said P-channel transistor.

3. The method of claim 2, wherein forming said second portion of the drain and source regions of said P-channel transistor comprises removing said material layer and implanting a P-type dopant in said P-channel transistor while masking said N-channel transistor.

4. The method of claim 3, wherein said drain and source extension regions and said second portions of the drain and source regions of said P-channel transistor and said N-channel transistor represent the entire drain and source regions of the P-channel transistor and the N-channel transistor, respectively.

5. The method of claim 2, further comprising forming third portions of deep drain and source regions in the P-channel transistor and the N-channel transistor.

6. The method of claim 1, wherein said material layer comprises silicon nitride.

7. The method of claim 1, wherein annealing said P-channel transistor and said N-channel transistor in the presence of said material layer is performed at a temperature of approximately 550-700° C.

8. The method of claim 5, wherein forming said third portions of said deep drain and source regions comprises forming a further spacer element adjacent to said spacer elements used for forming said second portions of the drain and source regions of the P-channel transistor and the N-channel transistor.

9. The method of claim 1, wherein forming said drain and source extension regions of said P-channel transistor comprises performing an implantation sequence including an amorphization implantation, a halo implantation and P-type dopant implantation and annealing said P-channel transistor after said implantation sequence.

10. The method of claim 9, wherein annealing said P-channel transistor is performed by at least one of a low-temperature anneal process and a short pulse radiation anneal process.

11. A method, comprising:
    forming drain and source extension regions in a first transistor by performing an ion implantation sequence while masking a second transistor;
    annealing said first and second transistors to provide the drain and source extension regions in said first transistor in a substantially crystalline state;
    forming a sacrificial material layer above said first transistor and said second transistor after annealing said first and second transistors, said second transistor having drain and source extension regions and first deeper drain and source regions formed after the annealing of said first and second transistors, at least a first portion of said first deeper drain and source regions in said second transistor being deeper than said drain and source regions in said first transistor;
    annealing said first and second transistors in the presence of said sacrificial material layer; and
    removing said sacrificial material layer prior to forming a first deeper drain and source portion in said first transistor.

12. The method of claim 11, further comprising forming a second deeper drain and source portion in said first and second transistors.

13. The method of claim 11, wherein said first deeper drain and source portion in each of said first and second transistors represents the complete drain and source regions of said first and second transistors.

14. The method of claim 11, wherein said at least a first deeper drain and source region in said second transistor is formed by providing a first spacer element on sidewalls of gate electrode structures of said first and second transistors prior to forming said sacrificial material layer.

15. The method of claim 14, further comprising forming a second spacer element adjacent to said first spacer element and forming a second deeper drain and source region in each of said first and second transistors using said second spacer element as an implantation mask.

16. The method of claim 11, wherein said second transistor is a transistor exhibiting increased transistor performance when generating tensile strain in a channel region thereof.

17. A method, comprising:
    defining at least a drain and source extension region in a first plurality of transistors by ion implantation;
    annealing said first plurality of transistors to reduce implantation-induced damage;

defining at least a drain and source extension region in a second plurality of transistors by ion implantation after annealing said drain and source extension region in said first plurality of transistors;

forming a deeper drain and source portion in said first plurality of transistors by ion implantation after annealing said drain and source extension region in said first plurality of transistors;

forming a material layer above said first and second pluralities of transistors;

forming a deeper drain and source portion in said second plurality of transistors after forming said material layer;

annealing said first and second pluralities of transistors in the presence of said material layer after forming said deeper drain and source portion in said second plurality of transistors to re-crystallize implantation-induced damage in said second plurality of transistors; and at least partially removing said material layer after annealing said first and second pluralities of transistors.

18. The method of claim 17, wherein defining at least said drain and source extension regions in said first plurality of transistors comprises forming a first type of a halo region in a first subset of said first plurality and forming a second, different type of a halo region in a second subset of said first plurality, wherein the first and second subsets comprise different subsets of said first plurality of transistors.

19. The method of claim 17, wherein defining said at least drain and source extension region in said second plurality of transistors comprises forming a first type of a halo region in a first subset of said second plurality and forming a second, different type of a halo region in a second subset of said second plurality, wherein the first and second subsets comprise different subsets of said second plurality of transistors.

20. The method of claim 17, further comprising forming sidewall spacer elements on sidewalls of gate electrode structures of said first and second pluralities of transistors prior to forming said material layer.

21. The method of claim 17, wherein said second plurality of transistors are N-channel transistors.

* * * * *